United States Patent [19]
Herr et al.

[11] Patent Number: 5,554,942
[45] Date of Patent: Sep. 10, 1996

[54] INTEGRATED CIRCUIT MEMORY HAVING A POWER SUPPLY INDEPENDENT INPUT BUFFER

[75] Inventors: Lawrence N. Herr, Coupland; Glenn E. Starnes, Austin, both of Tex.

[73] Assignee: Motorola Inc., Schaumburg, Ill.

[21] Appl. No.: 402,787

[22] Filed: Mar. 13, 1995

[51] Int. Cl.$^6$ .............................................. H03K 19/003
[52] U.S. Cl. .............................. 326/33; 326/80; 326/24; 327/205; 327/207
[58] Field of Search ............................. 326/24, 33, 64, 326/65, 70, 71, 72, 80, 81, 110; 327/205, 206, 207, 538, 539

[56] References Cited

U.S. PATENT DOCUMENTS

| | | | |
|---|---|---|---|
| 4,553,045 | 11/1985 | Murotani | 327/205 |
| 4,890,051 | 12/1989 | Kim et al. | 326/71 |
| 4,929,853 | 5/1990 | Kim et al. | 326/81 |
| 5,057,722 | 10/1991 | Kobatake | 327/288 |
| 5,068,548 | 11/1991 | El Gamel | 326/84 |
| 5,073,726 | 12/1991 | Kato et al. | 326/24 |
| 5,341,045 | 8/1994 | Almulla | 326/68 |
| 5,386,153 | 1/1995 | Voss et al. | 326/65 |
| 5,394,026 | 2/1995 | Yu et al. | 327/538 |
| 5,416,366 | 5/1995 | Adachi | 326/33 |

*Primary Examiner*—Edward P. Westin
*Assistant Examiner*—Benjamin D. Driscoll
*Attorney, Agent, or Firm*—Daniel D. Hill

[57] ABSTRACT

An integrated circuit memory (114) has a power supply independent address buffer (50) that comprises an inverter (60), a bipolar transistor (67), and a P-channel transistor (68). The inverter (60) has an output terminal coupled to a base of the bipolar transistor (67). The P-channel transistor (63) is for injecting a current at the output terminal of the inverter in response to a reference voltage. The reference voltage varies proportionally to variations of a power supply voltage in order to compensate for gate-to-source voltage changes of a P-channel transistor (61) of the inverter (60) that occurs as a result of a changing power supply voltage. For address buffer (50), a range of address transition times as a function of power supply voltage is decreased, thus improving an address set-up and hold time of the integrated circuit memory (114).

16 Claims, 6 Drawing Sheets

INTEGRATED CIRCUIT MEMORY HAVING A POWER SUPPLY INDEPENDENT INPUT BUFFER

FIELD OF THE INVENTION

This invention relates generally to integrated circuit memories, and more particularly, to an integrated circuit memory having a power supply independent input buffer.

BACKGROUND OF THE INVENTION

An input buffer is a gate that receives an input signal and isolates the input signal from a load. The input buffer may also restore the logic levels of the input signal, increase input signal margins, provide increased driving capability, and provide better noise immunity. An input buffer circuit in a integrated circuit, such as an integrated circuit memory, is used to buffer, for example, address signals, control signals, and data signals.

An input buffer must operate within a specified power supply voltage range, such as 3.3 volt±5%. Set-up and hold times for an address signal in an integrated circuit memory must be within specified parameters for the entire operating power supply voltage range. For example, the margins of an input buffer may be adversely affected if the power supply voltage varies from the designed power supply voltage range.

Figure 1:
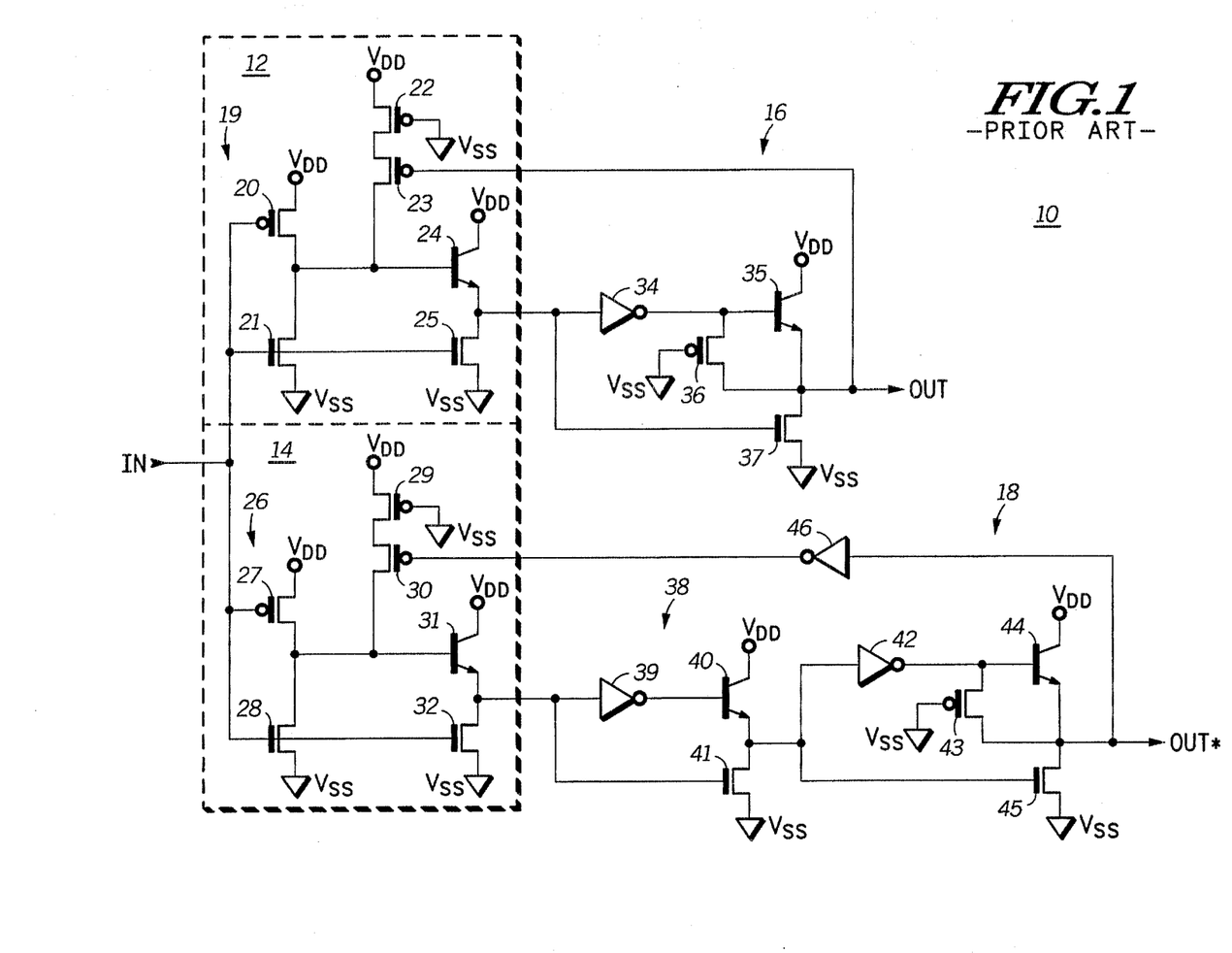
FIG. 1 illustrates, in partial schematic diagram form and partial logic diagram form, an input buffer in accordance with the prior art.

FIG. 1 illustrates, in partial schematic diagram form and partial logic diagram form, input buffer 10 in accordance with the prior art. Input buffer 10 includes first stages 12 and 14, and second stages 16 and 18. First stage 12 includes inverter 19, P-channel transistors 20, 22, and 23, NPN bipolar transistor 24, and N-channel transistor 25. Inverter 19 includes P-channel transistor 20 and N-channel transistor 21. First stage 14 includes inverter 26, P-channel transistors 27, 29, and 30, NPN bipolar transistor 31, and N-channel transistor 32. Inverter 26 includes P-channel transistor 27 and N-channel transistor 28. Second stage 16 includes inverter 34, P-channel transistor 36, NPN bipolar transistor 35, and N-channel transistor 37. Second stage 18 includes inverters 39, 42, and 46, NPN bipolar transistors 40 and 44, P-channel transistor 43, and N-channel transistors 41 and 45. Input buffer 10 receives a single-ended input signal, and in response, provides buffered differential signals, labeled "OUT" and "OUT*", corresponding to the input signal. Buffered differential signals OUT and OUT* may then be provided as input signals to other circuitry on the integrated circuit. Note that an asterisk (*) after a signal name indicates that the signal is a logical complement of a signal having the same name but lacking the asterisk (*). Input buffer 10 receives a power supply voltage through power supply voltage terminals labeled "$V_{DD}$", and power supply voltage terminus labeled "$V_{SS}$". The power supply voltage may vary from the specified voltage for various reasons.

Figure 2:
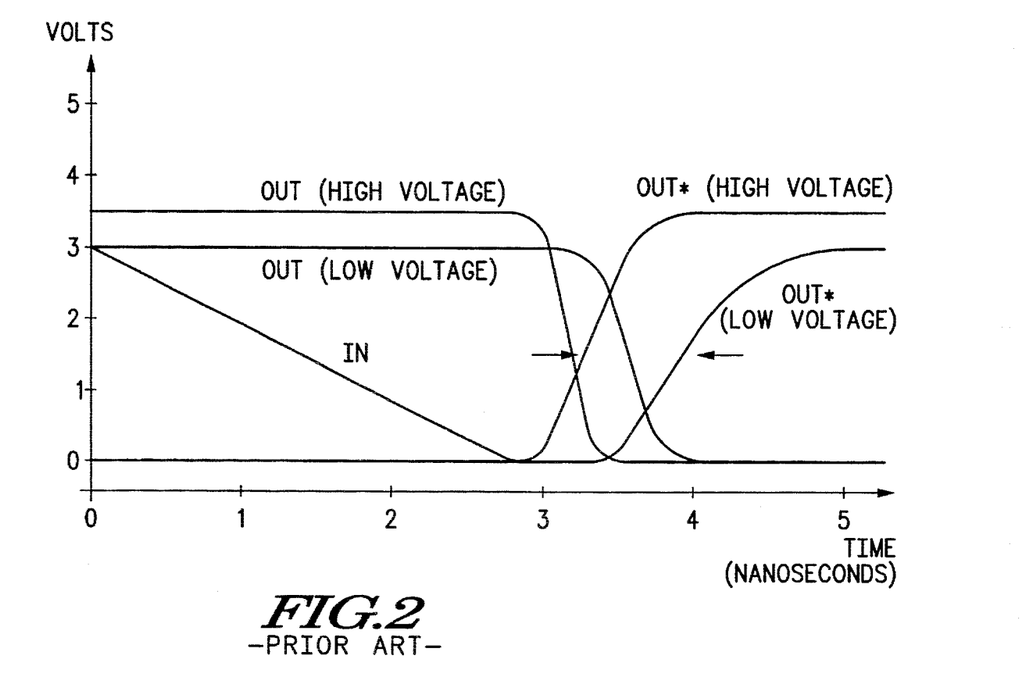
FIG. 2 illustrates a waveform of the transient response of the input buffer of FIG. 1 for relatively low and relatively high power supply voltage levels.
Figure 3:
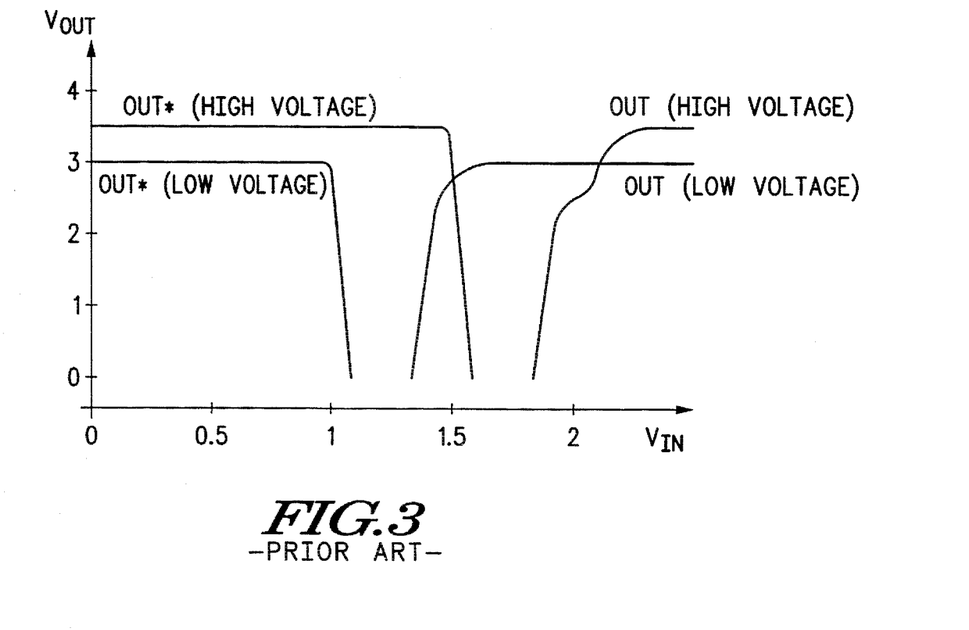
FIG. 3 illustrates a waveform of the DC response of the input buffer of FIG. 1 for low and high power supply voltage levels.

The operation of input buffer 10 will be described with reference to FIG. 2 and FIG. 3. FIG. 2 illustrates a waveform of the transient response of input buffer 10 of FIG. 1 for relatively low and relatively high power supply voltage levels. FIG. 3 illustrates a waveform of the DC response of input buffer 10 of FIG. 1 for the relatively low and relatively high power supply voltage levels. For purposes of discussion, the DC response is defined as the output signal response when the input signal transitions relatively slowly from one logic state to another. The transient response is defined as the output signal response when the input signal transitions within the target specification.

During normal operation of input buffer 10, an input signal labeled "IN" is provided to the gates of P-channel transistor 20 and N-channel transistor 21 of first stage 12 and the gates of P-channel transistor 27 and N-channel transistor 28 of first stage 14. As illustrated in FIG. 2, input signal IN transitions from a logic high voltage equal to about 3.0 volts to a logic low voltage equal to about zero volts. In order for a P-channel transistor to become conductive, its gate-to-source voltage ($V_{GS}$) must be more negative than the threshold voltage of the P-channel transistor. An N-channel transistor becomes conductive when its $V_{GS}$ is more positive than the threshold voltage of the N-channel transistor. P-channel transistors 213 and 27 go from being substantially non-conductive to being conductive as the voltage of input signal IN decreases below the threshold voltage of P-channel transistors 20 and 27. Also, N-channel transistors 21 and 28 go from being conductive to being substantially non-conductive as the voltage of input signal IN decreases below the threshold voltage of N-channel transistors 2i and 28. If the power supply voltage changes, the voltage of input signal IN which causes P-channel transistors 20 and 27 to become conductive changes because the $V_{GS}$ of P-channel transistors 20 and 27 changes with the power supply voltage. To illustrate this, FIG. 2 and FIG. 3 illustrate differential output signals OUT and OUT* at both a relatively high power supply voltage (about 3.5 volts) and at a relatively low power supply voltage (about 3.0 volts). In FIG. 2, differential output signals OUT and OUT* at the lower power supply voltage require more time to change logic states, in part because the $V_{GS}$ of P-channel transistors 20 and 27 is lower. Input signal IN must therefore be lower for the P-channel transistors to go from being non-conductive to conductive. Referring to FIG. 3, for the lower power supply voltage, differential output signals OUT/OUT* transition at a lower voltage level of input signal IN than the differential output signals OUT and OUT* of the high power supply voltage, thus increasing the range of output signal transitions for a varying power supply voltage.

If input buffer 10 is used as, for example, an address buffer in an integrated circuit memory, the address set-up and hold margins must be relatively large to account for changes in the power supply voltage. The larger set-up and hold margins limit the speed at which the integrated circuit memory can operate.

DESCRIPTION OF A PREFERRED EMBODIMENT

Generally, the present invention provides an input buffer having a response time that is substantially independent of power supply voltage. The input buffer comprises an inverter having an input terminal for receiving an input signal, and an output terminal for biasing a base of a bipolar transistor. The inverter comprises a first P-channel transistor and an N-channel transistor. A second P-channel transistor is coupled to the output terminal of the inverter for injecting a predetermined current at the output terminal of the inverter in response to a reference voltage. The reference voltage varies proportionally to variations of a power supply voltage to compensate for changes of a gate-to-source voltage of the first P-channel transistor of the inverter that occur as a result of a changing power supply voltage. Also, the second P-channel transistor helps to quickly bias the bipolar transistor when the input signal transitions from a logic high to a logic low voltage. At a relatively high power supply voltage, the reference voltage is relatively high to cause the second P-channel transistor to become less conductive, injecting less current at the output terminal of the inverter. At a relatively low power supply voltage, the reference voltage is proportionally lower to cause the second P-channel transistor to become more ,conductive, injecting more current at the output terminal of the inverter.

In an integrated circuit memory including the power supply independent input buffer as an address buffer, a range of address transition times as a function of power supply voltage is decreased, thus improving an address set-up and hold time of the integrated circuit memory.

Figure 4:
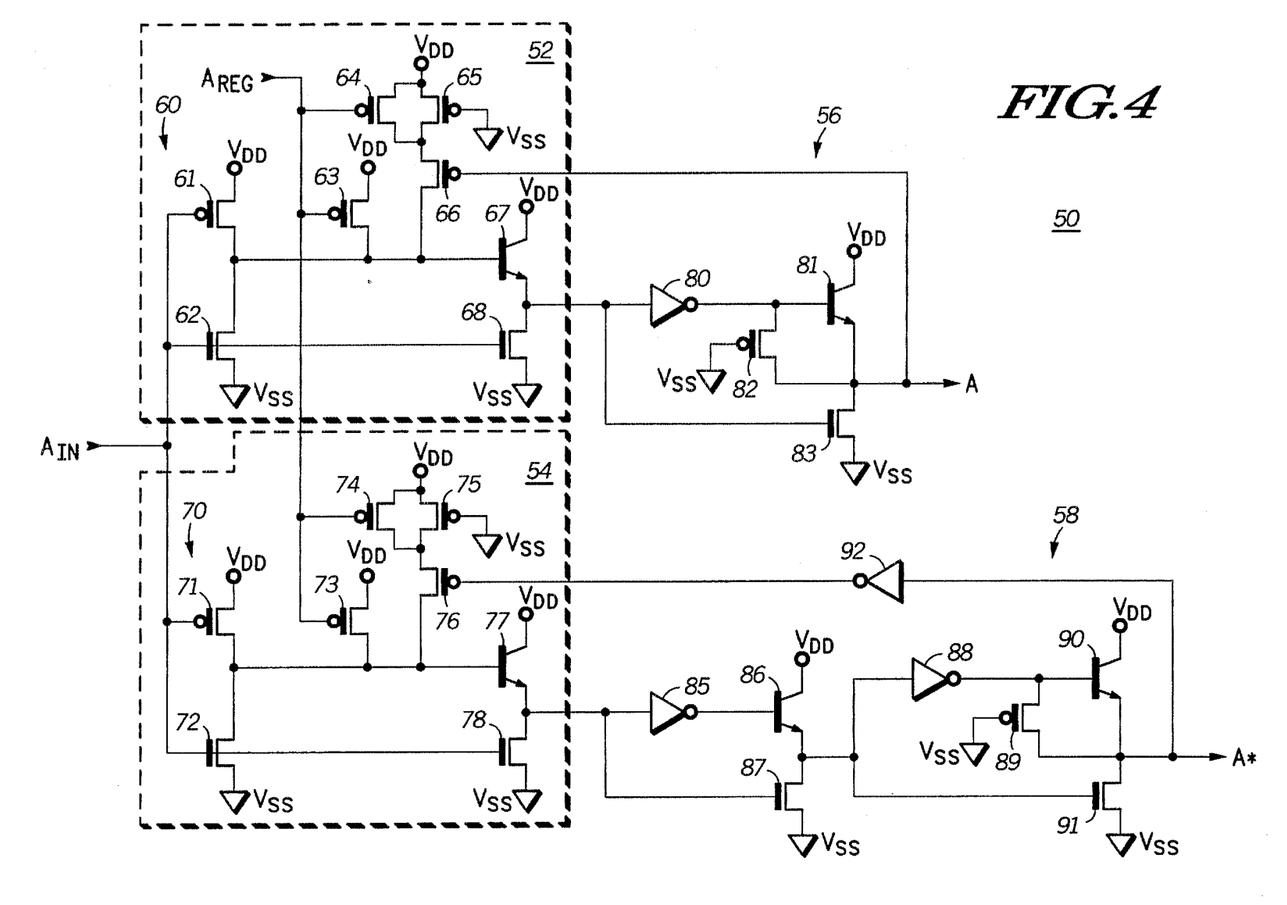
FIG. 4 illustrates, in partial schematic diagram form and partial logic diagram form, an address buffer in accordance with the present invention.

The present invention can be more fully described with reference to FIGS. 4–8. FIG. 4 illustrates, in partial schematic diagram form and partial logic diagram form, address buffer 50 in accordance with the present invention. Address buffer 50 includes first stages 52 and 54, and second stages 56 and 58. First stage 52 includes inverter 60, N-channel transistors 63, 64, 65, and 66, NPN bipolar transistor 67, and N-channel transistor 68. Inverter 60 includes P-channel transistor 61 and N-channel transistor 62. First stage 54 includes inverter 70, P-channel transistors 73, 74, 75, and 76, NPN bipolar transistor 77, and N-channel transistor 78. Inverter 70 includes P-channel transistor 71 and N-channel transistor 72. Second stage 56 includes inverter 80, P-channel transistor 82, NPN bipolar transistor 81, and N-channel transistor 83. Second stage 58 includes inverters 85, 88, and 92, NPN bipolar transistors 86 and 90, P-channel transistor 89, and N-channel transistors 87 and 91. A MOS (metal-oxide semiconductor) transistor comprises two current electrodes (source and drain), and a control electrode (gate). A P-channel transistor is an MOS transistor of one conductivity type, and an N-channel transistor is an MOS transistor of another conductivity type. A bipolar transistor comprises two current electrodes (collector and emitter), and a control electrode (base). Some integrated circuits may include MOS, or CMOS (complementary metal-oxide semiconductor), transistors with bipolar transistors on the same integrated circuit to exploit the advantages of each. These integrated circuits are commonly known as BIMOS or BICMOS integrated circuits, respectively.

In first stage 52, P-channel transistor 61 has a source connected to a power supply voltage terminal labeled "$V_{DD}$", a gate for receiving a single-ended input address signal labeled "$A_{IN}$", and a drain. N-channel transistor 62 has a drain connected to the drain of P-channel transistor 61, a gate connected to the gate of P-channel transistor 61, and a source connected to a power supply voltage terminal labeled "$V_{SS}$". The gates of P-channel transistor 61 and N-channel transistor 62 form an input terminal of inverter 60 and the connected drains of P-channel transistor 61 and N-channel transistor 62 form an output terminal of inverter 60. P-channel transistor 63 has a source connected to $V_{DD}$, a gate for receiving a reference voltage labeled "$A_{REG}$", and a drain connected to the output terminal of inverter 60. P-channel transistor 65 has a source connected to $V_{DD}$, a gate connected to $V_{SS}$, and a drain. P-channel transistor 66 has a source connected to the drain of P-channel transistor 65, a gate, and a drain connected to the output terminal of inverter 60. P-channel transistor 64 has a source connected to $V_{DD}$, a gate for receiving reference voltage $A_{REG}$, and a drain connected to the drain of P-channel transistor 65. NPN transistor 67 has a collector connected to $V_{DD}$, a base connected to the output terminal of inverter 60, and an emitter. N-channel transistor 68 has a drain connected to the emitter of NPN transistor 67, a gate for receiving input address signal $A_{IN}$, and a source connected to $V_{SS}$.

In second stage 56, inverter 80 has an input terminal connected to the emitter of NPN transistor 67, and an output terminal. NPN transistor 81 has a collector connected to $V_{DD}$, a base connected to the output terminal of inverter 80, and an emitter for providing an output signal labeled "A". The emitter of NPN transistor 81 is connected to the gate of P-channel transistor 66. N-channel transistor 83 has a drain connected to the emitter of NPN transistor 81, a gate connected to the emitter of NPN transistor 67, and a source connected to $V_{SS}$. P-channel transistor 82 has a source connected to the base of NPN transistor 81, a gate connected to $V_{SS}$, and a drain connected to the emitter of NPN transistor 81.

In first stage 54, P-channel transistor 71 has a source (current electrode) connected to a power supply voltage terminal labeled "$V_{DD}$", a gate (control electrode) for receiving an input address signal labeled "$A_{IN}$", and a drain (current electrode). N-channel transistor 72 has a drain connected to the drain of P-channel transistor 71, a gate connected to the gate of P-channel transistor 71, and a source connected to a power supply voltage terminal labeled "$V_{SS}$". The gates of P-channel transistor 71 and N-channel transistor 72 form an input terminal of inverter 70 and the connected drains of P-channel transistor 71 and N-channel transistor 72 form an Output terminal of inverter 70. P-channel transistor 73 has a source connected to $V_{DD}$, a gate for receiving a reference voltage labeled "$A_{REG}$", and a drain connected to the output terminal of inverter 70. P-channel transistor 75 has a source connected to $V_{DD}$, a gate connected to $V_{SS}$, and a drain. P-channel transistor 76 has a source connected to the drain of P-channel transistor 75, a gate, and a drain connected to the output terminal of inverter 70. P-channel transistor 74 has a source connected to $V_{DD}$, a gate for receiving reference voltage $A_{REG}$, and a drain connected to the drain of P-channel transistor 75. NPN transistor 77 has a collector (current electrode) connected to $V_{DD}$, a base (control electrode) connected to the output terminal of inverter 70, and an emitter (current electrode). N-channel transistor 78 has a drain connected to the emitter of NPN transistor 77, a gate for receiving input address signal $A_{IN}$, and a source connected to $V_{SS}$.

In second stage 58, inverter 85, NPN transistor 86, and N-channel transistor 87 form an inverter circuit. Inverter 85 has an input terminal connected to the emitter of NPN transistor 77, and an output terminal. NPN transistor 86 has a collector connected to $V_{DD}$, a base connected to the output terminal of inverter 85, and an emitter. N-channel transistor 87 has a drain connected to the emitter of NPN transistor 86, a gate connected to the emitter of NPN transistor 77, and a source connected to $V_{SS}$.

Inverter 88 has an input terminal connected to the emitter of NPN transistor 86, and an output terminal. NPN transistor 90 has a collector connected to $V_{DD}$, a base connected to the output terminal of inverter 88, and an emitter for providing an output signal labeled "A*". N-channel transistor 91 has a drain connected to the emitter of NPN transistor 90, a gate connected to the emitter of NPN transistor 86, and a source connected to $V_{SS}$. P-channel transistor 89 has a source connected to the base of NPN transistor 90, a gate connected to $V_{SS}$, and a drain connected to the emitter of NPN transistor 90. Inverter 92 has an input terminal connected to the emitter of NPN transistor 90, and an output terminal connected to the gate of P-channel transistor 76.

Figure 8:
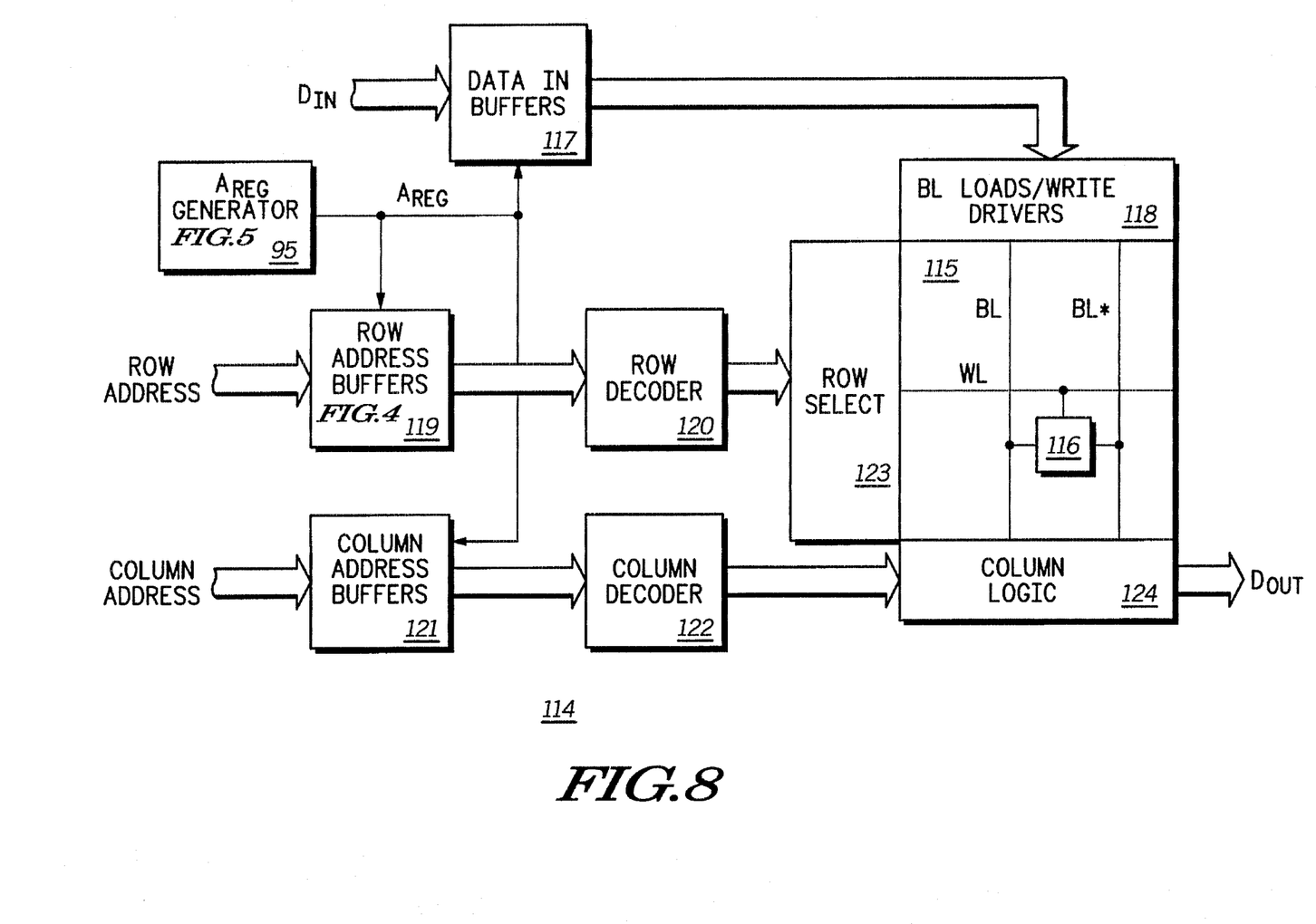
FIG. 8 illustrates, in block diagram form, an integrated circuit memory in accordance with the present invention.

In operation, address buffer 50 receives an externally generated single-ended input address signal $A_{IN}$, and in response, provides buffered differential output signals A and A* having a logic state corresponding to a logic state of input address signal $A_{IN}$. Input address signal $A_{IN}$ is a TTL (transistor-transistor logic) level address signal which swings from a logic high voltage of about 3.0 volts to a logic low voltage of about zero volts. $V_{DD}$ is coupled to a +3.3 volt power supply voltage, and $V_{SS}$ is coupled to ground, or zero volts. In a preferred embodiment, differential signals A and A* are provided to address decoders 120 and 122, which are illustrated in FIG. 8. In other embodiments, address buffer 50 may serve as an input buffer for receiving any digital input signal, including but not limited to, data signals, address signals, and control signals. Depending on the input signal levels, a level converter circuit may also be required in other embodiments. Also, for purposes of illustration, the power supply voltage in the illustrated embodiment is 3.3 volts. However, the particular power supply voltage is not important, and may be different in other embodiments.

When input address signal $A_{IN}$ is a logic high voltage of about 3.0 volts, P-channel transistors 61 and 71 are substantially non-conductive, and N-channel transistors 62 and 72 are conductive. A voltage at the base of NPN transistors 67 and 77 is reduced to about $V_{SS}$. N-channel transistors 68 and 78 are conductive, causing a logic low voltage to be provided to inverters 80 and 85, and to N-channel transistors 83 and 87. Inverter 80 provides a logic high voltage to the base of NPN transistor 81, causing output signal A to be a logic high voltage. NPN transistor 86 is conductive and N-channel transistor 87 is substantially non-conductive, causing a logic high voltage to be provided to inverter 88 and to N-channel transistor 91. Inverter 88 provides a logic low voltage to the base of NPN transistor 90. N-channel transistor 91 is conductive, causing output signal A* to be provided as a logic low voltage.

When input address signal $A_{IN}$ transitions from a logic high voltage to a logic low voltage, P-channel transistors 61 and 71 will become conductive when the voltage of input address signal $A_{IN}$ is decreased below the P-channel threshold voltage. N-channel transistors 62 and 72 will become substantially non-conductive when the voltage of input address signal $A_{IN}$ is reduced below the N-channel threshold voltage. To prevent changes in the magnitude of the power supply voltage from affecting when P-channel transistors 61 and 71 start to become conductive, reference voltage $A_{REC}$ is provided to the gates of P-channel transistors 63 and 73. Reference voltage $A_{REG}$ is generated by reference voltage generator 95, and varies generally proportionally to the power supply voltage. Reference voltage $A_{REG}$ and P-channel transistors 63 and 73 compensate for changes in the $V_{GS}$ of the P-channel transistor 61 of inverter 60 and P-channel transistor 71 of inverter 70 that occur as a result of variations in the power supply voltage. If the power supply voltage decreases, reference voltage $A_{REG}$ decreases to cause P-channel transistors 63 and 73 to become relatively more conductive. As P-channel transistors 63 and 73 become more conductive, a current is injected into the drains of P-channel transistors 61 and 71 to compensate for decreasing $V_{GS}$ of P-channel transistors 61 and 71. If the power supply voltage increases, reference voltage $A_{REG}$ increases, causing P-channel transistors 63 and 73 to be less conductive, thereby injecting relatively less current at the drains of P-channel transistors 61 and 71. In addition, the predetermined amount of injected current increases a bias voltage of bipolar transistors 67 and 77, enabling bipolar transistors 67 and 77 to become conductive more quickly at a relatively low power supply voltage. The operation of reference voltage generator 95 will be discussion in connection with FIG. 5.

P-channel transistors 64, 65, and 66 form a hysteresis circuit and provide a predetermined amount of hysteresis for first stage 52. P-channel transistors 74, 75, and 76 form a hysteresis circuit for providing a predetermined amount of hysteresis for first stage 54. Output signal A is provided to the gate of P-channel transistor 66. Output signal A* is inverted by inverter 92 and provided to the gate of P-channel transistor 76. P-channel transistors 64 and 74 receive reference voltage $A_{REG}$ and compensate for the amount of current injected by P-channel transistors 63 and 73. Hysteresis is used to limit the effects of noise and other transient signals on address buffer 50. P-channel transistor 82 provides reverse bias protection for NPN transistor 81, and P-channel transistor 89 provides reverse bias protection for NPN transistor 90.

By injecting more current into the base of NPN transistors 67 and 77 when the power supply voltage is low, the voltage at the base of NPN transistors 67 and 77 is increased more quickly when input address signal $A_{IN}$ is transitioning from a logic high voltage to a logic low voltage. This increases the speed at which a transition occurs when the power supply voltage is relatively low. In an integrated circuit memory including power supply independent address buffer 50, the range of address transition times as a function of the power supply voltage is decreased, thus improving the address set-up and hold times of the integrated circuit memory.

Figure 5:
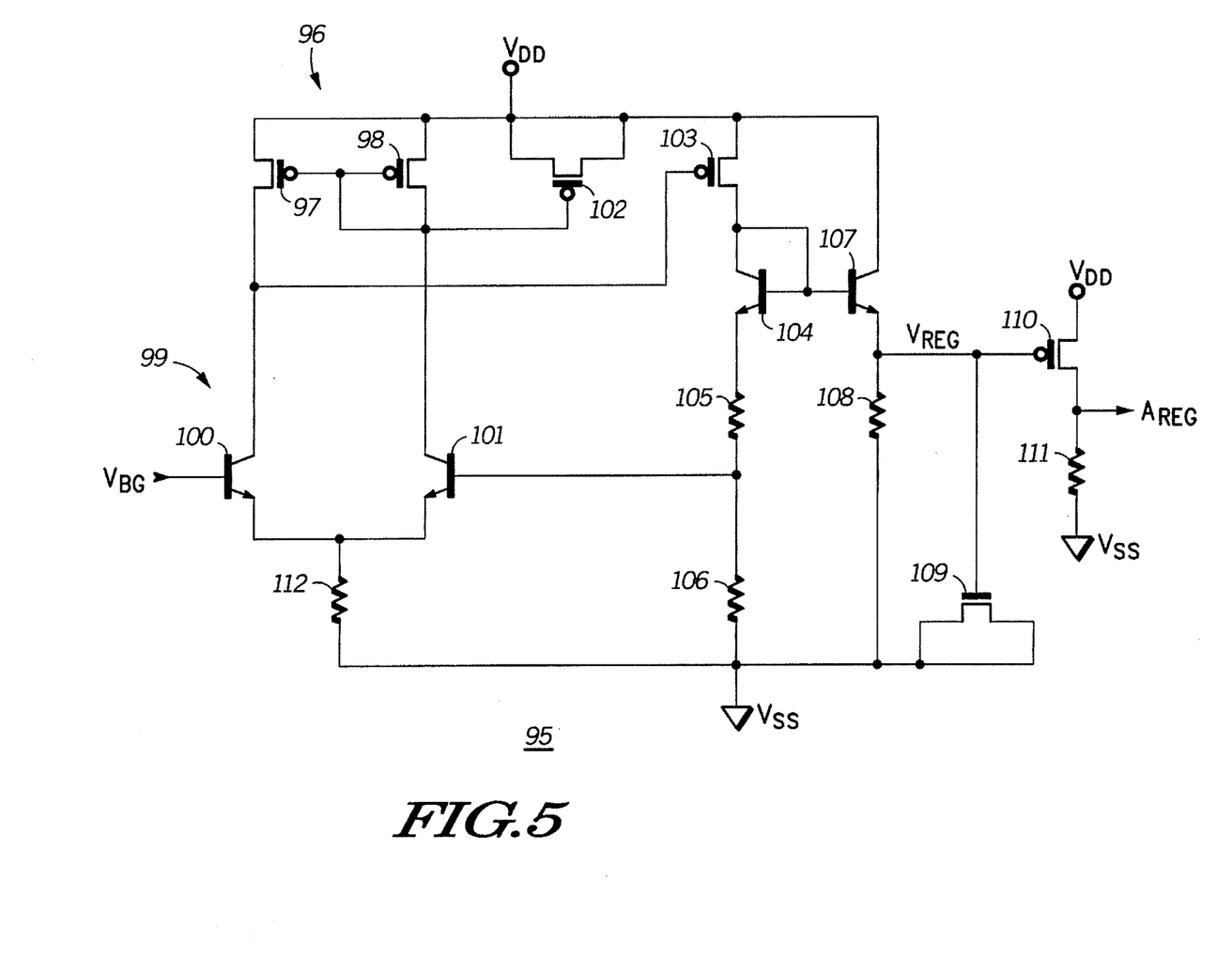
FIG. 5 illustrates, in schematic diagram form, a reference voltage generator in accordance with the present invention.

FIG. 5 illustrates, in schematic diagram form, reference voltage generator 95 in accordance with the present invention. Reference voltage generator 95 includes current mirror 96, differential pair 99, capacitors 102 and 109, P-channel transistors 103 and 110, NPN transistors 104 and 107, and resistors 105, 106, 108, 111, and 112. Current mirror 96 includes P-channel transistors 97 and 98. Differential pair 99 includes NPN transistors 100 and 101.

P-channel transistor 97 has a source connected to $V_{DD}$, a gate, and a drain. P-channel transistor 98 has a source connected to $V_{DD}$, a gate and a drain connected to the gate of P-channel transistor 97. NPN transistor 100 has a collector connected to the drain P-channel transistor 97, a base for receiving a band gap generated reference voltage labeled "$V_{BG}$", and an emitter. NPN transistor 101 has a collector connected to the drain of P-channel transistor 98, a base, and an emitter connected to the emitter of NPN transistor 100. Resistor 112 has a first terminal connected to the emitters of NPN transistors 100 and 101, and a second terminal connected to $V_{SS}$. Capacitor 102 is formed using a MOS P-channel transistor, and has a first plate connected to $V_{DD}$, and a second plate connected to the drain of P-channel transistor 98. P-channel transistor 103 has a source connected to $V_{DD}$, a gate connected to the collector of NPN transistor 100, and a drain. Diode-connected NPN transistor 104 has a base and a collector connected to the drain of P-channel transistor 103, and an emitter. Resistor 105 has a first terminal connected to the emitter of NPN transistor 104, and a second terminal connected to the base of NPN transistor 101. Resistor 106 has a first terminal connected to the second terminal of resistor 105, and a second terminal connected to $V_{SS}$. NPN transistor 107 has a collector connected to $V_{DD}$, a base connected to the drain of P-channel transistor 103, and an emitter for providing a voltage labeled "$V_{REG}$". Resistor 108 has a first terminal connected to the emitter of NPN transistor 107, and a second terminal connected to $V_{SS}$. Capacitor 109 has a first plate connected to the emitter of NPN transistor 107, and a second plate connected to $V_{SS}$. P-channel transistor 110 has a source connected to $V_{DD}$, a gate connected to the emitter of NPN transistor 107, and a drain for providing a reference voltage labeled "$A_{REG}$". Resistor 111 has a first terminal connected to the drain of P-channel transistor 110, and a second terminal connected to $V_{SS}$.

In operation, bandgap voltage $V_{BG}$ is provided to the base of NPN transistor 100. Bandgap voltage $V_{BG}$ is a conventional bandgap generated reference voltage, and is substantially independent of changes in power supply voltage, temperature, and processing. A current through P-channel transistor 97 is "mirrored" by P-channel transistor 98. If P-channel transistors 97 and 98 are approximately the same size, the current-through P-channel transistor 97 and the current through P-channel transistor 98 are about the same, causing a voltage at the base of NPN transistor 101 to be approximately equal to bandgap voltage $V_{BG}$. Since bandgap voltage $V_{BG}$ is independent of power supply voltage and temperature, the voltage drop across resistor 106 is also independent of power supply voltage and temperature. Also, the drain voltage of P-channel transistor 98 changes as $V_{DD}$ changes, which causes the gate voltage of P-channel transistor 103 to change proportional to changes in $V_{DD}$. P-channel transistor 103 provides a bias voltage to the bases of NPN transistors 104 and 107. NPN transistors 104 and 107 are the same size and therefore provide approximately the same current. Voltage $V_{REG}$ is equal to the voltage across resistor 108. Since both of NPN transistors 104 and 107 provide about the same amount of current, the voltage across resistor 108 is equal to the voltage across resistor 105 plus the voltage across resistor 106. A voltage drop across resistor 106 is equal to about the bandgap voltage $V_{BG}$. Voltage $V_{REG}$ is therefore a relatively constant voltage, independent of the power supply voltage. In a preferred embodiment, $V_{REG}$ is equal to about 1.65 volts with a 3.0 volt power supply. Also, in other embodiments, other reference voltage generator circuits that are capable of providing a voltage $V_{REG}$ independent of the power supply voltage can be used.

Voltage $V_{REG}$ is supplied to the gate of P-channel transistor 110. The voltage of reference voltage $A_{REG}$ is determined by the conductivity of P-channel transistor 110 and the size of resistor 111. In the illustrated embodiment, when the power supply voltage is equal to about 3.0 volts, reference voltage $A_{REG}$ is equal to about zero volts. When the power supply is equal to about 3.6 volts, reference voltage $A_{REG}$ is equal to about 3.0 volts.

Capacitors 102 and 109 are formed using MOS transistors. Capacitor 102 is provided to slow the response of current mirror 96, which stabilizes the response of voltage $V_{REG}$ to changes in $V_{DD}$. Capacitor 109 provides instantaneous charge to stabilize voltage $V_{REG}$ at the gate of P-channel transistor 110.

In the following discussion of FIG. 6 and FIG. 7, a transient response is defined as the output signal response when the input signal transitions within a target specification. A DC response is defined as an output signal response when the input signal transitions relatively slowly from one logic state to another logic state.

Figure 6:
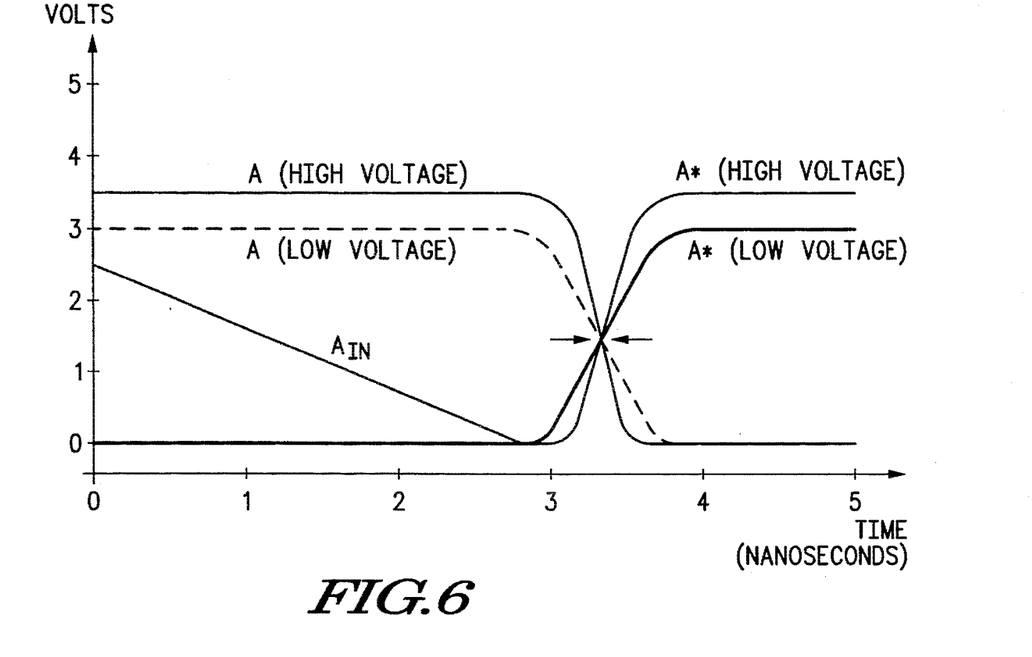
FIG. 6 illustrates a waveform of the transient response of the input buffer of FIG. 4 for relatively low and relatively high power supply voltage levels.

FIG. 6 illustrates a waveform of the transient response of differential output signals A and A* of address buffer 50 of FIG. 4 for a relatively low power supply voltage (about 3.0 volts) and a relatively high power supply voltage (about 3.5 volts). As compared to the transient waveform (FIG. 2) for prior art input buffer 10, differential output signals A and A* of address buffer 50 transition at approximately the same time in response to input address signal $A_{IN}$ transitioning from a logic high voltage to a logic low voltage at both the low and high power supply voltages.

Figure 7:
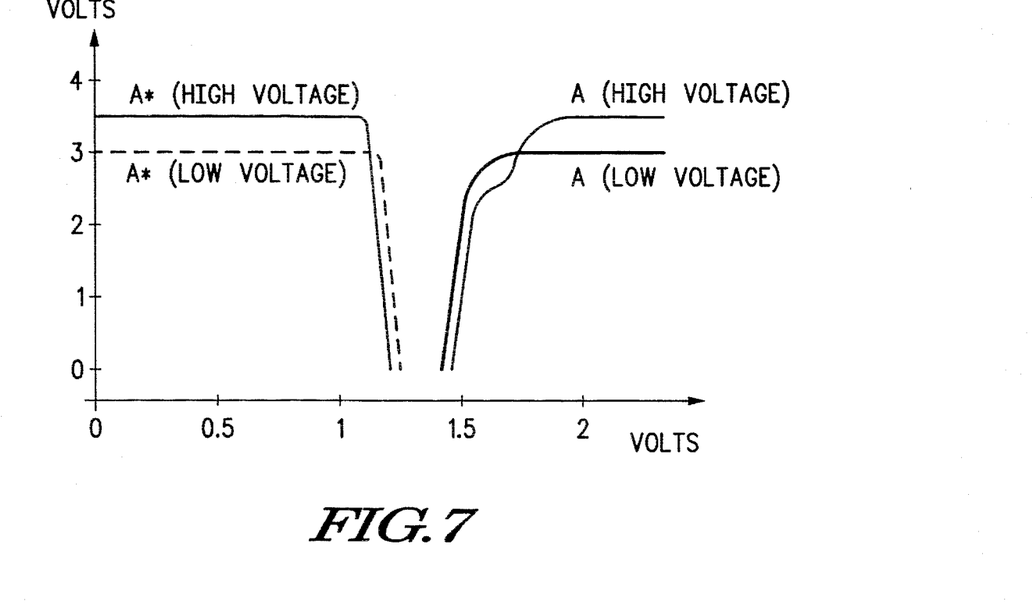
FIG. 7 illustrates a waveform of the DC response of the input buffer of FIG. 4 for the low and high power supply voltage levels.

FIG. 7 illustrates a waveform of the DC response of address buffer 50 of FIG. 4 for a relatively low power supply voltage (about 3.0 volts) and a relatively high power supply voltage (about 3.5 volts). Differential output signals A and A* change logic states within a relatively narrow window. In an integrated circuit memory, such as integrated circuit memory 114 illustrated in FIG. 8, the set-up and hold times for the address signals can be significantly reduced, allowing for increased margins and faster operating speeds.

FIG. 8 illustrates, in block diagram form, integrated circuit memory 114 in accordance with the present invention. Integrated circuit memory 114 includes memory array 115, row address buffers 119, column address buffers 121, row decoder 120, column decoder 122, row select 123, column logic 124, bit line loads/write drivers 118, $A_{REG}$ reference voltage generator 95, and data in buffers 117. Integrated circuit memory 114 is fabricated using BICMOS technology. Memory array 115 includes an array of static random access memory (SRAM) cells. Each memory cell is coupled to a bit line pair and to a word line. A representative memory cell 116 is shown coupled to a bit line pair labeled "BL" and "BL*" and to a word line labeled "WL".

Row address buffers 119 receives a plurality of row address signals labeled "ROW ADDRESS" and provides a plurality of buffered differential row address signals to row decoder 120. Column address buffers 121 receives a plurality of column address signals labeled "COLUMN ADDRESS" and a plurality of buffered differential column address signals to column decoder 122. Row address buffers 119 includes an address buffer 50 (FIG. 4) for each address signal received by row address buffers 119. Also, column address buffers 121 includes a column address buffer similar to address buffer 50 for each column address signal received by column address buffers 121. Row decoder 120 and column decoder 122 each provides a plurality of decoded address signals to row select 123 and column logic 124, respectively. In response to receiving the decoded address signals, row select 123 selects a word line in memory array 115, and column logic 124 selects a bit line pair. A memory cell located at the intersection of the word line and the bit line pair receives data via the bit line pair during a write cycle, or provides data to the bit line pair during a read cycle. Note that the particular address signals provided by row decoder 120 and column decoder 122 have no special significance and may be different in other embodiments. Also, the amount of decoding performed by row decoder 120 and column decoder 122 is not important for describing the invention and may be different in other embodiments.

As discussed above in connection with FIG. 5, reference voltage generator circuit 95 generates reference voltage $A_{REG}$. Reference voltage $A_{REG}$ is provided to each row address buffer of row address buffers 119, to each column address buffer of column address buffers 121, and to each data in buffer of data in buffers 117. Data in buffers 117 includes a buffer circuit similar to address buffer 50 (FIG. 4) for each input data signal received by data in buffers 117. Note that in the illustrated embodiment, one reference voltage generator 95 provides reference voltage $A_{REG}$ to each input buffer of integrated circuit memory 114. However, in other embodiments, more than one reference voltage generator 95 may be used to provide a reference voltage for each of the address and data input buffer circuits.

During a read cycle of integrated circuit memory 114, row address signals ROW ADDRESS are provided to row address buffers 119 and column address signals COLUMN ADDRESS are provided to column address buffers 121 to select a memory cell to be read, for example, memory cell 116. Data is provided by memory cell 116 to bit line pair BL/BL*, in the form of a differential voltage between the bit lines of the bit line pair. A sense amplifier in column logic 124 senses and amplifies the differential voltage and provides the differential voltage through column logic 124 in the form of data output signals $D_{OUT}$. Data output signals $D_{OUT}$ are provided to output buffers (not shown) that correspond to data stored in the selected memory cell. The number of data signals provided for a particular address, or thee particular data organization, is not significant and may be different in other embodiments.

During a write cycle of memory 114, row address signals ROW ADDRESS are provided to row address buffers 119 and column address signals COLUMN ADDRESS are provided to column address buffers 121 to select a memory cell to be written to, for example, memory cell 116. Single-ended data signals labeled "$D_{IN}$" are provided to data in buffers 117. Differential data signals, corresponding to data in signals $D_{IN}$, are provided to bit line loads/write drivers 118. A selected bit line pair, for example bit line pair BL/BL*, receives the differential data signals in the form of a differential voltage, and provides the differential voltage to a memory cell that is coupled to the selected word line and bit line pair. The differential voltage provided to the bit line pair is large enough to overwrite, if necessary, the data stored in the selected memory cell. Following the write cycle, the bit line loads equalize the differential voltage on the bit line pairs in preparation for a read cycle.

By including address buffer 50 in integrated circuit memory 114, the range of address transition times as a function of the power supply voltage is decreased, thus improving the address set-up and hold times of the integrated circuit memory, and thereby improving margins and the speed of integrated circuit memory 114.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An integrated circuit memory, comprising:

an input buffer having an inverter, the inverter having an input terminal for receiving an input signal and an output terminal for providing an output signal in response to the input signal, the inverter comprising a first transistor of a first conductivity type and a second transistor of a second conductivity type;

a third transistor, coupled between the output terminal of the inverter and a first power supply voltage terminal, for coupling the output terminal of the inverter to the first power supply voltage terminal in response to a reference voltage, the reference voltage varying in response to variations in a power supply voltage; and a hysteresis circuit, coupled to the input buffer, for providing hysteresis to the input buffer.

2. The integrated circuit memory of claim 1, further comprising:

a bipolar transistor having a first current electrode coupled to the first power supply voltage terminal, a control electrode coupled to the output terminal of the inverter, and a second current electrode; and a fourth transistor having a first current electrode coupled to the second current electrode of the bipolar transistor, a control electrode for receiving the input signal, and a second current electrode coupled to a second power supply voltage terminal.

3. The integrated circuit memory of claim 1, wherein the reference voltage is provided by a reference voltage generator circuit, the reference voltage generator circuit comprising:

a circuit for generating a relatively constant voltage, the relatively constant voltage substantially independent of the power supply voltage;

a fourth transistor having a first current electrode coupled to the first power supply voltage terminal, a control electrode coupled to the circuit for generating a relatively constant voltage, and a second current electrode for providing the reference voltage; and a resistor having a first terminal coupled to the second current electrode of the fourth transistor, and a second terminal coupled to a second power supply voltage terminal.

4. The integrated circuit memory of claim 1, wherein the integrated circuit memory comprises a plurality of static random access memory cells.

5. The integrated circuit memory of claim 1, wherein the input buffer is characterized as being an address buffer.

6. The integrated circuit memory of claim 1, wherein the input buffer comprises a first input buffer and a second input buffer, the first input buffer and the second input buffer for receiving the input signal, and in response, providing differential output signals.

7. An integrated circuit memory comprising an input buffer, the input buffer comprising:

an inverter, the inverter having an input terminal for receiving an input signal and an output terminal for providing an output signal in response to the input signal, the inverter comprising a first transistor of a first conductivity type and a second transistor of a second conductivity type;

a first bipolar transistor having a first current electrode coupled to a first power supply voltage terminal, a control electrode coupled to the output terminal of the inverter, and a second current electrode;

a third transistor of the second conductivity type having a first current electrode coupled to the second current electrode of the first bipolar transistor, a control electrode for receiving the input signal, and a second current electrode coupled to a second power supply voltage terminal;

a fourth transistor of the first conductivity type, coupled between the control electrode of the first bipolar transistor and the first power supply voltage terminal, for injecting a predetermined current at the control electrode of the first bipolar transistor, wherein the predetermined current is proportional to variations in a power supply voltage; and a reference voltage generator, comprising:

a circuit for generating a relatively constant voltage, the relatively constant voltage substantially independent of the power supply voltage;

a fifth transistor having a first current electrode coupled to the first power supply voltage terminal, a control electrode coupled to circuit for generating a relatively constant voltage, and a second current electrode; and a resistor having a first terminal coupled to the second current electrode of the fifth transistor, and a second terminal coupled to the second power supply voltage terminal.

8. The integrated circuit memory of claim 7, wherein the input buffer is characterized as being an address buffer.

9. The integrated circuit memory of claim 7, wherein the first and fourth transistors are P-channel transistors and the second and third transistors are N-channel transistors.

10. The integrated circuit memory of claim 7, wherein the integrated circuit memory comprises a plurality of static random access memory cells.

11. The integrated circuit memory of claim 7, wherein the input buffer is a first stage of an address buffer.

12. The integrated circuit memory of claim 11, further comprising a hysteresis circuit for providing hysteresis to the input buffer.

13. The integrated circuit memory of claim 12, further comprising a second stage, the second stage comprising:

a second inverter having an input terminal coupled to the second current electrode of the first bipolar transistor, and an output terminal;

a second bipolar transistor having a first current electrode coupled to the first power supply voltage terminal, a control electrode coupled to the output terminal of the second inverter, and a second current electrode coupled to the hysteresis circuit;

a fifth transistor of the second conductivity type having a first current electrode coupled to the second current electrode of the second bipolar transistor, a control electrode coupled to the second current electrode of the first bipolar transistor, and a second current electrode coupled to the second power supply voltage terminal; and a sixth transistor of the first conductivity type, having a first current electrode coupled to the control electrode of the second bipolar transistor, a control electrode coupled to the second power supply voltage terminal, and a second current electrode coupled to the second power supply voltage terminal.

14. A static random access memory, comprising:

a plurality of memory cells, a memory cell of the plurality of memory cells coupled to a bit line pair and a word line;

an address buffer for receiving art address signal for selecting the memory cell, the address buffer comprising:

an inverter, the inverter having an input terminal for receiving the address signal and an output terminal for providing an output signal in response to the address signal, the inverter comprising a first transistor of a first conductivity type and a second transistor of a second conductivity type;

a first bipolar transistor having a first current electrode coupled to a first power supply voltage terminal, a control electrode coupled to the output terminal of the inverter, and a second current electrode;

a third transistor of the second conductivity type having a first current electrode coupled to the second current electrode of the first bipolar transistor, a control electrode for receiving the address signal, and a second current electrode coupled to a second power supply voltage terminal; and a fourth transistor of the first conductivity type, coupled between the control electrode of the first bipolar transistor and the first power supply voltage terminal, for injecting a predetermined current at the control electrode of the first bipolar transistor, wherein the predetermined current is proportional to variations in a power supply voltage; and a hysteresis circuit, coupled to the address buffer, for providing hysteresis to the address buffer.

15. The static random access memory of claim 14, further comprising a reference voltage generator for providing a reference voltage to a control electrode of the fourth transistor, the reference voltage varying in response to the variations in the power supply voltage.

16. The static random access memory of claim 14, wherein the hysteresis circuit is coupled to the control electrode of the first bipolar transistor, the hysteresis circuit receiving the reference voltage, and in response, providing a predetermined amount of hysteresis to the address buffer.

* * * * *